United States Patent [19]

Salkeld et al.

[11] 4,412,577

[45] Nov. 1, 1983

[54] CONTROL OF SEED MELT-BACK DURING DIRECTIONAL SOLIDIFICATION OF METALS

[75] Inventors: Richard W. Salkeld, South Windsor; Neal P. Anderson, Broad Brook; Anthony F. Giamei, Middletown, all of Conn.

[73] Assignee: United Technologies Corporation, Hartford, Conn.

[21] Appl. No.: 343,083

[22] Filed: Jan. 27, 1982

[51] Int. Cl.³ .............................................. B22D 25/00
[52] U.S. Cl. ............................. 164/122.2; 164/122.1; 156/616 R
[58] Field of Search ................. 164/122.1, 122.2, 127; 156/616 R, 616 A

[56] References Cited

U.S. PATENT DOCUMENTS

| 3,260,505 | 7/1966 | Ver Snyder | 253/77 |
| 3,494,709 | 2/1970 | Piearcey | 416/232 |
| 3,763,926 | 10/1973 | Tschinkel et al. | 164/338.1 |
| 3,857,436 | 12/1974 | Petrov et al. | 164/122.2 |
| 4,015,657 | 4/1977 | Petrov et al. | 164/361 |
| 4,190,094 | 2/1980 | Giamei | 164/122.1 |
| 4,209,348 | 6/1980 | Duhl et al. | 148/3 |
| 4,289,570 | 9/1981 | Terkelsen | 164/122.1 |

Primary Examiner—Kuang Y. Lin
Attorney, Agent, or Firm—C. G. Nessler

[57] ABSTRACT

In the manufacture of a single crystal article, by the directional solidification of a metal in a ceramic mold the melt-back of a seed crystal is controlled to provide high casting yield. The melt-back, measured as a fraction of the original length of the seed, is preferably between 25–75%, more preferably between 33–67%. Diametrical clearance between the seed and mold is also closely controlled, between 0.06–0.25 mm, to eliminate extraneous grain nucleation.

6 Claims, 8 Drawing Figures

CONTROL OF SEED MELT-BACK DURING DIRECTIONAL SOLIDIFICATION OF METALS

DESCRIPTION

TECHNICAL FIELD

The present invention relates to the field of casting, more particularly to the directional solidification of metal castings by epitaxial growth from seeds.

BACKGROUND

Directional solidification is a method of casting whereby a solidification interface is caused to move progressively through a mold filled with molten metal. Both columnar grain castings, such as disclosed in U.S. Pat. No. 3,260,505 to VerSnyder and single crystal castings, such as those disclosed in U.S. Pat. No. 3,494,709 to Piearcey, are usefully made by directional solidification. In the most common industrial practice, articles are formed by making a ceramic mold in the shape desired, placing the mold within a furnace, and causing the molten metal poured into the mold to cool progressively from the bottom of the mold to the top.

In certain circumstances it is desired that the article have a very particular crystallographic structure. For example, a single crystal casting may be sought where there is a particular orientation of the crystallographic axes with respect to the x, y and z axes of the article. In other instances, it may be desired that an article have different structures in different parts of the casting. To achieve such results, it is common to use a metal seed, placed within the mold prior to the introduction of the molten metal. When the molten metal is poured into the mold, the seed is caused to partially melt where it is contacted by the molten metal. Thereafter, progressive cooling of the casting causes metal to solidify epitaxially from the portion of the seed which was not melted.

It is obvious that a seed cannot be entirely melted, and that it must be somewhat melted, to carry out the objects of epitaxial solidification. However, in commercial and experimental casting of nickel superalloy articles, it is observed that even when casting takes place within the foregoing obvious limitations, the resultant cast articles do not always have the crystallographic structure which is desired and expected as a result of epitaxial growth from the seed. Consequently, research work has been undertaken to discover a solution to the problem of improving seeded casting yields.

DISCLOSURE OF INVENTION

An object of the invention is to improve the directional solidification casting process, so that greater yields of controlled crystallographic structure articles result when seeding is used.

According to the invention, a seed contained within a directional solidification mold must be melted back at least 25%, and not more than 75%, of its length, prior to the initiation of epitaxial solidification. Preferably, the degree of melt-back is between 33–67% of the length of the seed, as it is measured along the axis which solidification will be caused to move.

The aforesaid control of melt-back is achieved by controlling the temperature of the mold and molten metal which is introduced into the mold. In the practice of the invention with nickel superalloys, a seed will characteristically have a lateral dimension of about 1.3 cm and a length of about 1–5 cm. To avoid nucleation of extraneous grains, the seed will fit closely the contour of the mold, in the preferred practice of the invention. It is found that use of the invention substantially increases casting yields.

BEST MODE FOR CARRYING OUT THE INVENTION

The invention herein is described in terms of the casting of a face centered cubic nickel superalloy in a ceramic mold. But, it will be appreciated that the invention will be applicable to the casting of other metals in many variations of the directional solidification process. The invention is also described in terms of the casting of a single crystal article from a single crystal seed, using a nickel alloy such as described in U.S. Pat. No. 4,209,348. However, it will be appreciated that the invention will be applicable as well to the casting of columnar grain structures and such other microstructures, as may be produced with directional solidification and epitaxy from a seed.

The general procedures of directional solidification are described in the technical literature and in numerous U.S. Patents including the U.S. Patents cited in the Background, and U.S. Pat. No. 4,190,094 to Giamei, an inventor herein, U.S. Pat. No. 3,763,926 to Tschinkel et al. (all of common assignee with the present invention), the disclosures of which are hereby incorporated by reference.

Figure 1:
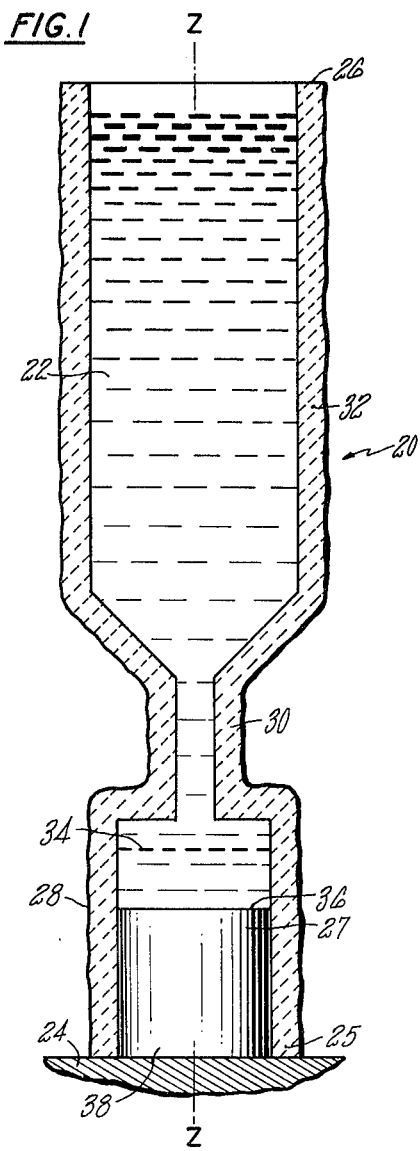
FIG. 1 shows molten metal contained in the ceramic mold mounted on a chill plate, with a seed at the bottom of the mold for epitaxial solidification of the molten metal.

FIG. 1 shows a ceramic mold 20 filled with molten metal 22. The mold is contained in a directional solidification furnace (not shown) which is adapted to heat the mold and subsequently cause a thermal gradient to move along the longitudinal z axis of the mold, from its bottom 25 where it rests on the chill plate 24, to its top 26. The mold is comprised of three separate portions. At the end nearest the chill plate is the seed or starter section 28; immediately above the seed-containing section is a constricted section 30, also called a selector section, and; above the constricted section is the article-defining cavity 32. Omitted from the drawing for purpose of simplification is the gating and riser which is ordinarily attached to the top 26 of the mold. Contained within the starter section is a partially melted seed 27, with an upper solid surface 36. The phantom line 34 indicates the z axis length (about 2 cm) which the seed had prior to melting. The portion of the starter section of the mold in the vicinity of the line 34 is above the melting point of the metal, and it is this, plus the superheat of the molten metal at the time of its introduction, which has caused the melting back of the seed.

The degree to which a seed melts back is a function of a multiplicity of parameters. As indicated, the temperature of the furnace and mold can be such that the upper surface of the seed melts, even prior to the introduction of the molten metal. The end 38 of the seed which is in contact with the chill plate 24 is cooled; conduction through the seed will maintain proximate portions more distant from the chill plate at a sufficiently low temperature, so that they also do not melt. Nonetheless, it is possible with proper mold insulation, sufficient heating temperature and time, and superheat in the molten metal, the melt the seed to a much greater degree than shown in the Figure. This is elaborated on further below.

Figure 2:
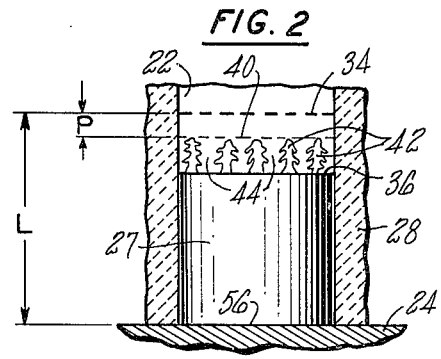
FIG. 2 is a more detailed view of the lower portion, or starter section, of the mold and seed of FIG. 1.

FIG. 2 shows in more detail the condition of the seed 27 as it appears when it is partially melted back and in equilibrium with molten metal 22 contained within the mold. As a matter of definition herein, the degree of melting back P is a measure of the distance which the liquidus 40 moves with the respect to the original surface 34 of the seed, stated as a fraction of the total length L of the seed prior to heating thereof. (Ordinarily, the location of the solidification interface in a casting is defined as being at the mean point between the solidus and liquidus interfaces. The reason why the liquidus interface is taken as a measure of the degree of melt-back will become apparent from further discussion herein.) The liquidus interface 40 lies further from the chill plate 24 than the solidus interface 36 does, since the temperature rises with distance from the chill plate. Within the solidification zone defined by the liquidus and solidus interfaces are dendrites 42, surrounded by a liquid matrix 44. See FIG. 13 of application Ser. No. 330,911, filed Dec. 14, 1981 by the inventors hereof. When the thermal gradient is caused to move vertically upward, and through the molten metal in the mold, the casting solidifies through the growth of the dendrites and solidification of the matrix material. The solidification zone, between the liquidus and solidus interfaces, is often characterized as a "mushy zone" because it is comprised of solid and liquid. It is a zone with little mechanical stability or resistance to external forces.

Figure 4:
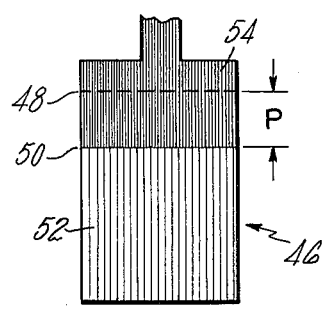
FIG. 4 is a line drawing simulative of the casting shown in FIG. 3, and illustrates the definition of melt-back distance P.
Figure 3:
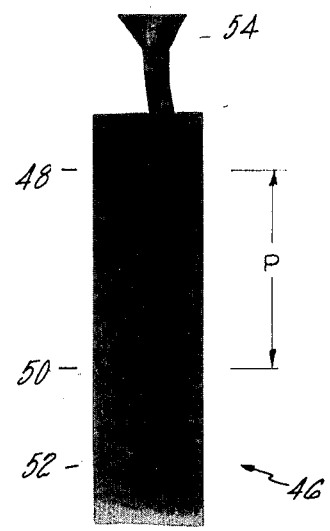
FIG. 3 is a photograph of a nickel alloy casting which has been etched to show its crystallographic structure; the casting comprises a portion of the seed and the metal epitaxially solidified therefrom.

FIG. 3 shows the portion of a casting which has been removed from the starter and constricted sections of the mold, after a single crystal casting has been solidified. The casting is etched to reveal its crystal structure. FIG. 4 is a line drawing of the casting photographed in FIG. 3. The designations on FIGS. 3 and 4 are analogous.

Figure 5:
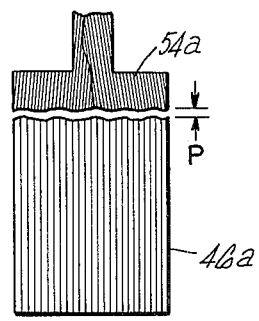
FIG. 5 is analogous to FIG. 4 and shows a casting which results when there is insufficient melt-back.
Figure 6:
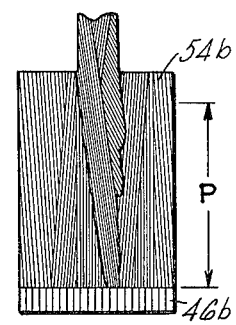
FIG. 6 is analogous to FIG. 4 and shows a casting which results when there is too much melt-back.

FIGS. 4-6 are similar in nature and the description herein for FIG. 4 is pertinent to them. The bracketed region P indicates the distance of melt-back which has occured during the casting process. The phantom line 48 indicates the length of the seed before casting, and the line 50 indicates the demarcation between the part 52 of the original seed which was not melted and the portion 54 of the casting which was epitaxially grown from the seed.

FIG. 5 shows a casting which was made with inadequate seed melt-back. Even though a portion of the seed was melted, the melting was insufficient for epitaxy to take place. As a result the part 54a which solidified above the seed is characterized by more than one grain, meaning that it is not epitaxial from the single crystal of the seed 46a. As the Figure indicates, the casting 54a is in fact mechanically disconnected from the seed 46a. Oftentimes there is an oxide surface film on the top surface of a seed, formed before the molten metal is introduced. See U.S. Pat. No. 4,289,570 to Terkelsen. As a result, even though there is melting of the seed, the conditions may be insufficient to disrupt the oxide film, and the probability of getting epitaxy is substantially lowered. Sufficient melt-back raises the probability. In addition, insufficient melt-back of the seed is often associated with temperatures in the seed cavity which are too low. When this occurs, there is a greater chance for extraneous nucleation, i.e., nucleation from sources other than the seed, such as the ceramic sides of the mold. The growth from the extraneous nuclei can propagate toward and through the selector section, thus giving an article with a structure non-epitaxial with the seed. To substantially avoid the aforementioned defects in casting, it is necessary that the seed be melted back at least 25%, and preferably 33%, of its original length.

FIG. 6 illustrates a casting portion resulting when the seed is melted back an amount which is too great. It is seen that the newly-solidified portion 54b is characterized by more than one grain. The remaining original portion of the seed 46b is seen to be relatively short in length, as measured along the z axis. Melt-back of more than 67-75% is associated with poor article casting results. This can be understood from the discussion concerning FIG. 2, because the mushy zone in a nickel superalloy can be relatively wide. A typical nickel superalloy has a melting point (liquidus) of about 1400° C. Therefore, the location defined by the line 40 in FIG. 2 will be at this temperature. The temperature difference between the liquidus and solidus for nickel superalloys ranges between 80°-170° C. Thus, the region at the line 36 will be 80°-170° C. lower in temperature than the region at line 40. Usually, the chill plate 24 is maintained just below room temperature. However, the interface 56 between the seed and the chill plate surface usually inhibits heat transfer. Therefore, the bulk of the seed 27 is at a relatively high temperature, and the thermal gradient will not be so steep as might first appear. The net result is that the mushy zone can be about 1-2 cm in thickness, as measured along the z axis.

Referring again to FIG. 6, it can be understood now why too severe a degree of melt-back will give a deviant casting. The mushy zone can comprise virtually the total remaining "unmelted" portion 46b of the seed. Since, as pointed out, the mushy zone is mechanically unstable, the dendrites in the "unmelted" part of the seed can shift or move about. Such movement can change the crystal structure locally, and result in nonuniform crystal growth above the seed. Another factor which will contribute to deviant epitaxial growth with too much melt-back is the fact that the liquidus (melt-back) interface may not be a flat plane as suggested by the Figures. In reality, it often may have a curved contour and there may be variations at different points across the lateral plane of the seed.

Figure 7:
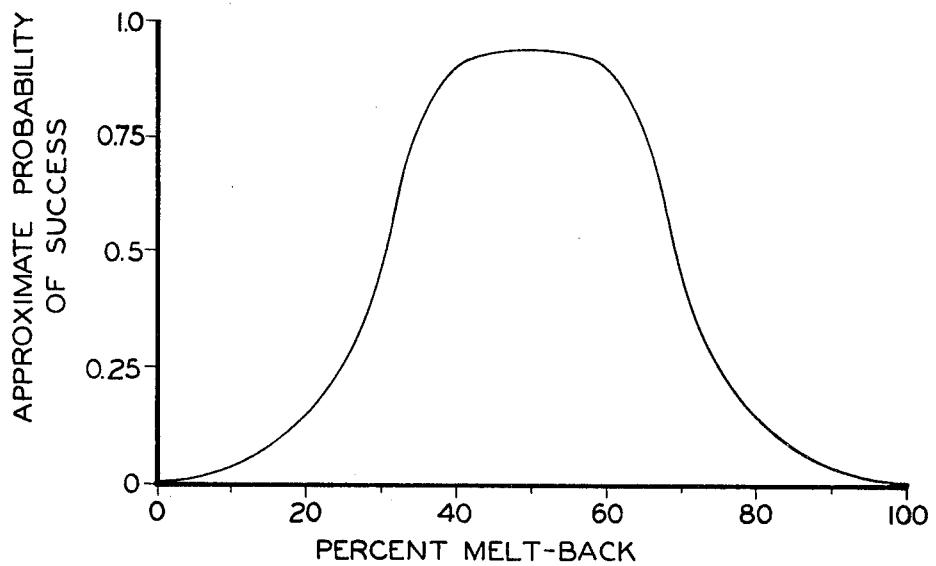
FIG. 7 shows how casting yield, measured according to desired crystal structure in the article, varies with the degree of melt-back of a seed crystal.

Numerous experiments have been run to ascertain the proper degree of melt back. The results have been assessed by generally using the techniques described above, and by measuring the crystal structure of the articles formed during casting. FIG. 7 summarizes the findings. It is seen that when the melt-back is 0 or 100% there is minimal probability of success, where success is defined as obtaining an article casting have the crystal structure of the seed. Between 33–67% melt-back there is a good probability of getting satisfactory castings, sufficient for purposes of ordinary commerce. The probability will not be 1.0 since there are other factors (such as imperfections in the thermal gradient, extraneous nucleation within the article cavity, defects in seeds, degradation in crystallographic growth in the article cavity, dendritic arm breakage, etc.) which will influence the results. The Figure also shows that between 25–75% reasonably good probability of success (greater than about 0.25) is encountered.

Of course, the actual physical length of melt back in accord with the foregoing percentage ranges will vary with the overall length of the seed. Our discovery is based on seed lengths ranging between about 1–5 cm, and typically about 3–4 cm. Practically speaking smaller lengths become somewhat difficult, in an industrial context, to melt-back because of excess criticality, due to the small physical tolerance. Greater lengths are also to be avoided because of increased seed costs and overall mold length, but they may be used occasionally. Therefore, to state our invention more generally, the seed must be melted back sufficient to physically disrupt surface films on the surface of the seed, but insufficient to cause the portion of the seed farthest from the article cavity to rise above the solidus temperature. Whether one has kept within the foregoing melting limits can be ascertained by metallographic inspection as suggested by FIG. 2. A non-disrupted surface film will be evident. (In passing it may be noted that epitaxial growth can be observed to have taken place even if the surface film is not disrupted; but non-disrupted surface films are associated with both too little melt-back and lower probability of success.) Similarly, a skilled person can determine if the portion of the seed farthest from the chill plate has been raised above the solidus. As in any controlled process, the superheat of the mold or molten metal, or the insulation characteristics of the mold will be changed, to put the process within the desired seed melt-back limits once a deviation is observed.

Figure 8:
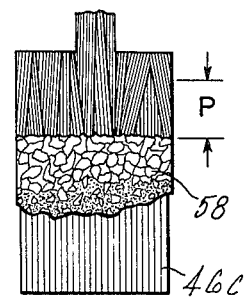
FIG. 8 is analogous to FIG. 4 and shows the casting which results when the seed crystal fits too loosely into the mold.

The invention was discovered, and is especially pertinent to the casting of nickel base alloys in ceramic investment casting molds. Such molds, typically about 8 mm thick, are comprised predominantly of zirconium, alumina, or silica, according to the choice of the user. See U.S. Pat. Nos. 2,912,729 to Webb and 2,961,751 to Operhall et al. The ceramic molds have a thermal expansion coefficients in the range $4-11 \times 10^6$ per °C. while the nickel alloys have coefficients in the range $10-17 \times 10^{-6}$ per °C. Thus, it is important that the seed not fit too tightly in the ceramic mold. Otherwise, upon heating the seed will expand and cause the mold to fracture. On the other hand, it is important that the seed not fit too loosely in the mold, because extraneous nucleation will likely occur, as indicated by the casting shown in FIG. 8. Metal 58 has flowed between the seed and mold wall, and frozen as it entered the colder regions nearer to the chill plate. This frozen material 58 has random orientation, and with onset of directional solidification, deviant crystal growth has resulted, compared to that desired. We have found that for a nickel alloy seed of about 1 cm lateral dimension, using a zircon base ceramic mold, the seed should have less clearance than 0.25 mm; preferably about 0.08 mm, as measured on the seed and seed cavity diameter prior to heating, to avoid the foregoing defect. But the clearance should be greater than about 0.06 mm to avoid cracking of the mold. This fit tolerance should be conformed to when the seed is melted back in accord with our invention. Our invention has been described in terms of a seed resting on a chill plate, but it will be pertinent as well to other casting apparatus configurations and methods wherein the seed is cooled by other means, such as radiation to a heat sink, etc.

Although this invention has been shown and described with respect to a preferred embodiment, it will be understood by those skilled in the art that various changes in form and detail thereof may be made without departing from the spirit and scope of the claimed invention.

We claim:

1. The process of directional solidification from molten metal of an article having a structure which is epitaxial with a seed which comprises forming a mold, placing an original seed within the mold, heating the mold, melting a portion of the seed by contacting a seed surface with molten metal placed in the mold, and epitaxially solidifying the molten metal, characterized by melting a portion of the seed length which is at least 25% of the original seed length, the melted portion of the seed length being measured from the original molten metal contacting surface before melting to the location of the liquidus interface after melting, the melting being sufficient to cause physical disruption of surface films on the surface of the seed where it is contacted by molten metal to be epitaxially solidified, and insufficient to raise above the metal solidus temperature the portion of the seed which is most distant from the region where it is contacted by the molten metal to be epitaxially solidified.

2. The process of claim 1 characterized by melting a portion which is more than 25 percent but less than 75 percent of the original seed length.

3. The process of claim 2 characterized by melting a portion which is more than 33 percent but less than 67 percent of the original seed length.

4. The process of claims 1 or 2 wherein the seed is a nickel superalloy.

5. The process of claim 4 wherein the seed is a single crystal.

6. The process of claim 4 wherein the mold is a ceramic investment shell mold, having a starter section shaped to encompass a seed, a selector section connected to the starter section to provide a reduced cross section solidification growth path, and an article section connected to the selector section to define the shape of the article, characterized by providing a lateral clearance space of between 0.06–0.25 mm, as measured diametrically between the seed and the starter section of the mold which surrounds the seed.

* * * * *